(12) United States Patent
Hammond et al.

(10) Patent No.: US 6,680,496 B1
(45) Date of Patent: Jan. 20, 2004

(54) BACK-BIASING TO POPULATE STRAINED LAYER QUANTUM WELLS

(75) Inventors: Richard Hammond, Cambridge, MA (US); Glyn Braithwaite, Hooksett, NH (US)

(73) Assignee: AmberWave Systems Corp., Salem, NH (US)

( * ) Notice: Subject to any disclaimer, the term of this patent is extended or adjusted under 35 U.S.C. 154(b) by 0 days.

(21) Appl. No.: 10/191,006

(22) Filed: Jul. 8, 2002

(51) Int. Cl.[7] .............................................. H01L 29/78
(52) U.S. Cl. .......................... 257/192; 257/19; 257/20; 257/616
(58) Field of Search .......................... 257/19, 20, 192, 257/616

(56) References Cited

U.S. PATENT DOCUMENTS

| | | | |
|---|---|---|---|
| 4,908,681 A | | 3/1990 | Nishida et al. |
| 5,272,365 A | * | 12/1993 | Nakagawa .................. 257/192 |
| 5,534,713 A | | 7/1996 | Ismail et al. |
| 5,557,231 A | | 9/1996 | Yamaguchi et al. |
| 5,672,995 A | | 9/1997 | Hirase et al. |
| 5,692,002 A | | 11/1997 | Mizutani |
| 5,821,577 A | * | 10/1998 | Crabbe' et al. ............. 257/616 |
| 5,877,056 A | | 3/1999 | Wu |
| 6,040,208 A | | 3/2000 | Honeycutt et al. |
| 6,111,267 A | * | 8/2000 | Fischer et al. ................ 257/19 |
| 6,207,978 B1 | * | 3/2001 | Fastow ........................ 257/192 |
| 6,284,615 B1 | | 9/2001 | Pinto et al. |
| 6,310,367 B1 | | 10/2001 | Yagishita et al. |
| 6,313,016 B1 | | 11/2001 | Kibbel et al. |
| 6,313,486 B1 | * | 11/2001 | Kencke et al. ............... 257/192 |
| 6,350,993 B1 | * | 2/2002 | Chu et al. ..................... 257/19 |
| 6,407,406 B1 | * | 6/2002 | Tezuka ......................... 257/19 |
| 6,448,840 B2 | | 9/2002 | Kao et al. |
| 6,455,871 B1 | * | 9/2002 | Shim et al. ................... 257/19 |
| 6,555,839 B2 | * | 4/2003 | Fitzgerald ..................... 257/19 |

OTHER PUBLICATIONS

Miyazaki, A delay distribution squeezing scheme with speed–adaptive threshold–voltage CMOS for low voltage LSIs. ISLPED '98 (International Symposium on Low Power Electronics and Design), pp. 48–53, 1998.

Burd, "A Dynamic Voltage Scaled Microprocessor System," OSSCC Technical Digest, pp. 294–295, Feb. 2000.

Gonzalez, "Supply and Threshold Voltage Scaling for Low Power CMOS," JSSC, pp1210–1216, Aug. 1997.

Kaenel, "Automatic Adjustment of Threshold and Supply Voltages for Minimum Power Consumption in CMOS Digital Circuits," ISLPED 1994.

* cited by examiner

*Primary Examiner*—Gene M. Munson
(74) *Attorney, Agent, or Firm*—Testa, Hurwitz & Thibeault LLP (57) ABSTRACT

Transistors including a buried channel layer intermediate to a source and a drain and a surface layer intermediate to the buried layer and a gate are operated so as to cause current between the source and the drain to flow predominately through the buried channel layer by applying a back-bias voltage to the transistor. The back-bias voltage modulates a free charge carrier density distribution in the buried layer and in the surface layer.

26 Claims, 9 Drawing Sheets

BACK-BIASING TO POPULATE STRAINED LAYER QUANTUM WELLS

TECHNICAL FIELD

The invention generally relates to semiconductor devices, and, more particularly, to transistors that include buried channel layers.

BACKGROUND INFORMATION

Certain microelectronics systems, such as radars, satellites, and cell phones, often require low-power, high-speed and high-density circuits having a high signal-to-noise ratio (i.e., low noise). These requirements present significant design challenges both at the circuit design and at the transistor design level.

Microelectronic devices that include both analog and digital circuits can fulfill all these requirements. Typically, analog circuits are used to satisfy very high speed and low noise requirements, while digital circuits are used to satisfy high density and low power requirements.

Microelectronic devices that include both analog and digital circuits on the same silicon substrate typically include surface channel metal oxide semiconductor field-effect transistors (MOSFET). Surface channel analog MOSFETs, however, incur noise problems because noise is induced at high frequencies due to charge carrier scattering along the silicon surface channel/gate oxide interface. Thus, for high-speed analog devices, bipolar transistors are often preferred over surface channel field-effect transistors (FETs); bipolar transistor-based circuits can exhibit lower noise because conduction does not occur along a semiconductor-insulator interface. Unfortunately, it is difficult to integrate both bipolar and surface channel MOSFET devices on a single substrate.

One way to reduce noise and to integrate digital and analog circuits is through use of both surface channel and buried channel transistors. A buried channel FET can have a channel conduction layer that is buried between doped silicon regions. A buried channel device can exhibit low noise because the conduction occurs in a layer that is spaced. e.g., from a silicon/$SiO_2$ interface.

Current flow in a buried channel FET can be controlled by controlled doping of a hetero-semiconductor buried layer. The channel may be formed in a region that includes a narrow bandgap semiconductor. Alternatively, the buried layer can be a quantum well (typically, an ultra-thin layer of narrower bandgap semiconductor sandwiched between two layers of larger bandgap semiconductors).

The conductivity of the buried channel is also controlled by a gate bias voltage. In order to operate the transistor, the buried layer often requires doping control to assist population of the channel with free charge carriers.

Some buried channel transistors include a narrow bandgap InGaAs quantum well and an intermediate bandgap AlGaAs layer; the well is disposed beneath the heterointerface of the InGaAs single quantum well with a wide bandgap AlGaAs layer. A thin charge sheet having the same conductivity type as the wide bandgap layer is formed at the heterointerface. As the magnitude of the gate voltage increases, an enhanced concentration of free charge carriers in the quantum well may occur.

It has been found, however, that driving the gate voltage high enough to accomplish quantum well population typically creates a parallel conduction channel in the surface semiconductor layer, due to formation of an inversion region in the surface layer. The surface inversion layer again leads to noise problems since conduction can then appear at the semiconductor/oxide interface. The surface conduction path can also use excess power.

A further problem arises because buried channel devices often utilize advanced doping techniques to ensure that a quantum well is populated with charge carriers. To achieve the doping desired in the buried channel layer, the device layers above the buried channel are also partially doped, thus requiring a complex process of counter-doping device layers.

Relatively exotic ion implantation processes can be used to create effective buried channel devices. For example, a buried channel p-MOSFET device can utilize plasma-doping to fabricate a very shallow p-type channel layer on the top surface of a sub-micrometer buried channel p-MOSFET. The buried channel p-MOSFET device formed using this method has a higher current drivability and a higher anti-punchthrough resistance.

Moreover, it is difficult to provide enhanced current drive for both electrons and holes (i.e., n-type and p-type buried channel devices) on the same substrate due to added complexity in the semiconductor fabrication; the required ion implantations and counter-doping can demand intricate processing steps.

SUMMARY OF THE INVENTION

The invention involves semiconductor devices that include buried channel layers having heterojunction offsets, and involves the use of back-biasing to control free charge carrier density in a buried channel and a surface layer of the devices. Back-biasing is applied, for example, via substrate or body-biasing. Features of the invention provide, in particular, improved field-effect transistors that include, for example, a strained buried layer of silicon, germanium or SiGe.

The invention can provide, for example, lower noise, greater carrier mobility, and both p-channel and n-channel buried layer devices in a single integrated circuit. For example, a transistor according to the invention can have improved low-frequency noise (Flicker noise), for use in oscillator circuits. In particular, the invention can provide transistors well suited to subthreshold and analog operation. For example, the invention can provide analog and radio-frequency devices having transistors with increased transconductance, where a buried layer has carrier mobility superior to carrier mobility in a surface layer. The invention also provides simpler device manufacturing, and can eliminate a need for complex doping steps during fabrication.

In preferred embodiments, the invention entails devices that include buried strained-layer quantum wells within multi-layer heterostructures, and entails methods of using back-biasing to populate the buried layers. The back-bias voltage controls preferential population of charge carriers in the buried layer while leaving a surface layer relatively free of mobile charge carriers.

Thus, in a first aspect, the invention features a method for operating one or more transistors. The method includes providing a transistor, which includes a buried channel layer intermediate to a source and a drain and a surface layer intermediate to the buried layer and a gate. The method also includes causing current between the source and the drain to flow predominately through the buried channel layer by applying a back-bias voltage to the transistor. The back-bias voltage modulates a free charge carrier density distribution in the buried layer and in the surface layer.

The back-bias voltage can substantially prevent formation of an inversion region in the surface layer. The back-bias voltage can be selected in cooperation with a gate voltage to cause radio-frequency operation of the transistor. A range of gate voltages can be selected to operate the transistor in a substantially linear drain current versus source voltage condition. The transistor can be operated as an analog device, for example, a power device.

The buried channel layer can include a semiconductor of different composition from neighboring, contiguous layers. The buried layer can be in direct contact with the surface layer, or with additional intermediate layers. The interface with a neighboring layer can provide a heterojunction offset. The offset can assist confinement of free charge carriers within the buried layer. The buried channel layer can be, for example, a quantum well.

The buried channel layer can include a strained semiconductor, and the surface layer can include a semiconductor that is substantially strain-free. The buried layer can reside on a relaxed layer, which can include silicon and germanium.

In some embodiments, the strained semiconductor is under tensile strain, and applying the back-bias voltage causes the buried channel layer to provide an n-type channel. The method can further include providing a second transistor associated with the first transistor. The second transistor includes a second buried channel layer, which includes a semiconductor under compressive strain. Applying a second back-bias voltage to the second transistor causes the second buried channel layer to provide a p-type channel.

The back-bias voltage in some embodiments is applied to a substrate, and in other embodiments is applied to an intermediate layer adjacent to the transistor.

In a second aspect, the invention features a semiconductor device. The device includes a transistor, which includes a buried channel layer and a surface layer. The device also includes a terminal facilitating application of a voltage to the gate to control a current between the source and the drain. The device includes a charge carrier modulator facilitating application of a back-bias voltage to the transistor. The back-bias voltage modulates the free charge carrier density distribution in the buried layer and in the surface layer. The modulation of the free charge carrier density distribution causes the current to flow predominately through the buried channel layer.

The buried channel layer can consist substantially of silicon or germanium, or can include silicon and germanium. The buried channel layer can include a semiconductor under compressive or tensile strain.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DESCRIPTION

Various features of the invention are well suited to application in metal-oxide-semiconductor (MOS) transistors having Si, $Si_{1-x}Ge_x$ and/or Ge layers in and/or on a substrate. Preferred embodiments employ back-biasing to control the population of free charge carriers in buried channel hetero-semiconductor layers relative to the population of free charge carriers in surface channel layers. The combination of heterojunction-based buried layers and back-biasing mitigate the problems of surface channel noise and control of surface channel and buried channel inversion layers, among other advantages.

The term "MOS" is here used to refer generally to semiconductor devices that include a conductive gate spaced at least-by an insulting layer from a semiconducting channel layer. The terms "SiGe" and "$Si_{1-x}Ge_x$" are here used interchangeably to refer to silicon-germanium alloys.

Figure 1:
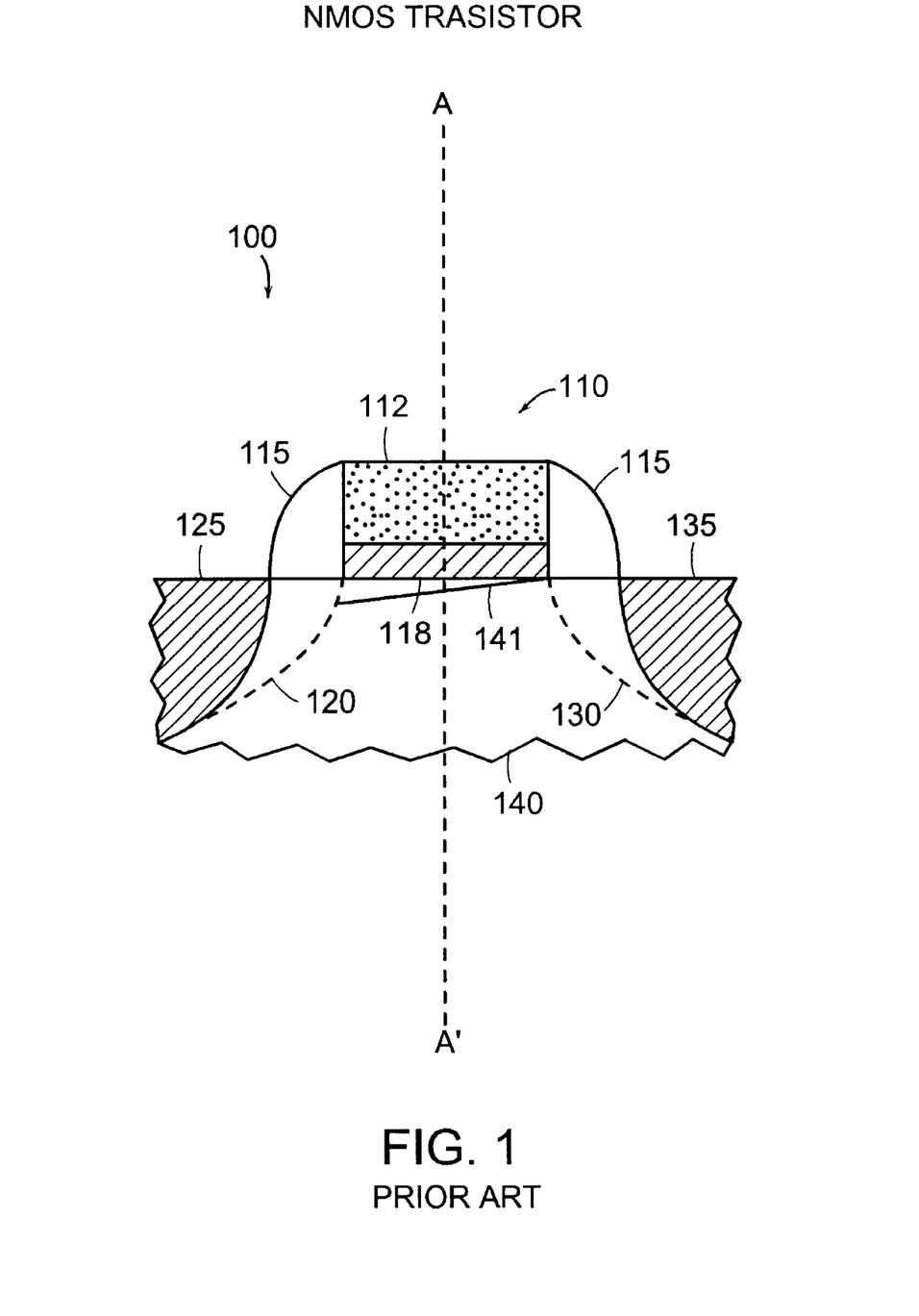
FIG. 1 is a cross-sectional view of a conventional silicon-based n-channel MOSFET.
Figure 2A:
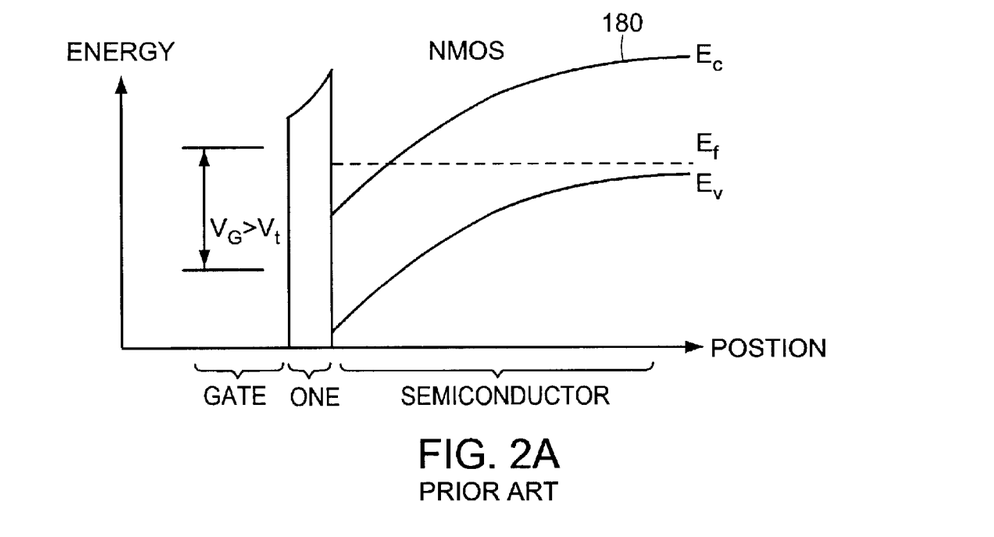
FIGS. 2A–C are energy band diagrams for the conventional transistor of FIG. 1 for three different gate voltage settings.
Figure 2B:
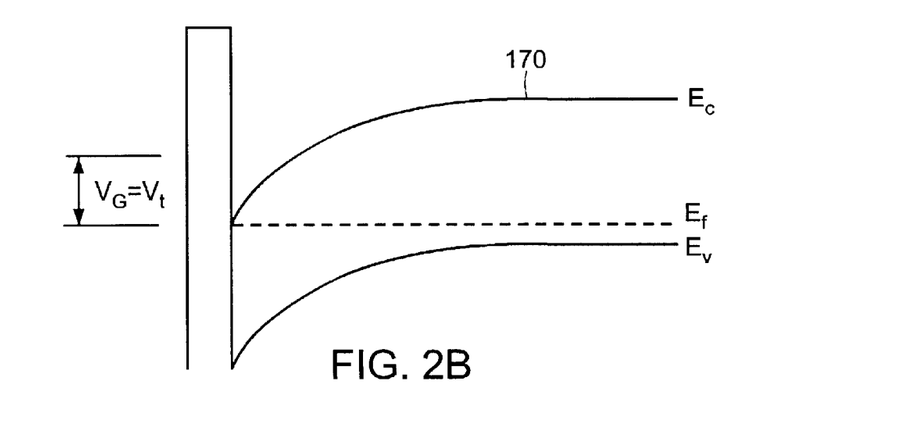
Figure 2C:
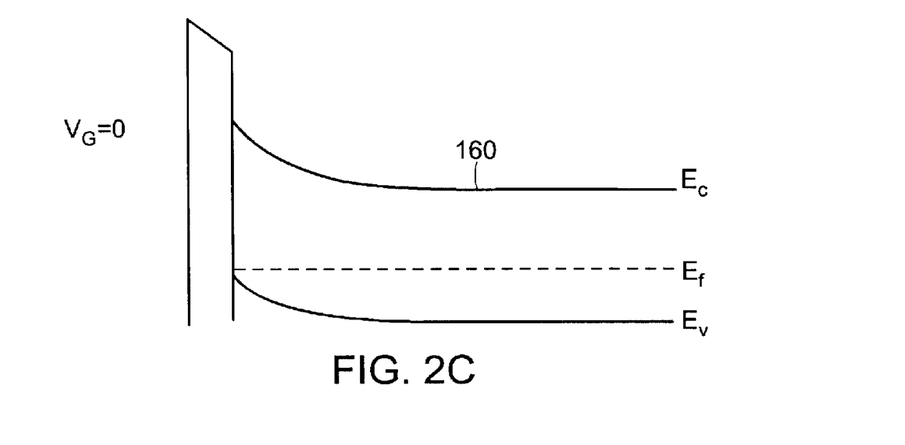

First, to provide a context for description of features of the invention, the structure and operation of a conventional MOSFET are described, with reference to FIGS. 1–2. FIG. 1 is cross-sectional view of a conventional (enhancement mode) silicon-based n-channel MOSFET 100. The transistor includes a gate 110, spacers 115, a source 120, a source silicide contact 125, a gate oxide 118, a drain 130, a drain silicide contact 135 and a silicon substrate 140. During operation, the MOSFET 100 can have an electron inversion layer 141 (under appropriate gate bias conditions).

The gate 110 includes a doped, conductive polycrystalline silicon ("polysilicon") portion 112 next to the gate oxide 118. The source 120 and drain 130 include n-type doped regions formed by diffusion in the p-type substrate. The substrate can include a p-type epitaxial layer, in which the MOSFET 100 is fabricated.

In operation, the gate contact 110 is biased with a gate voltage to control the population of minority carrier electrons in the inversion layer 141 in the substrate 140 adjacent to the interface with the gate oxide 118. The combination of the gate voltage and a voltage difference between the source 125 and drain 135 controls the flow of current between the source 125 and drain 135.

The MOSFET 100 has a surface channel, which may be defined in physical or electrical terms. Physically, the surface channel is the p-type semiconductor material that neighbors the gate oxide 118 and which joins the source 125 and drain 135. Electrically, the channel is the inversion layer 141, which provides current flow. Thus, from the electrical point of view, the presence and condition of the channel are variable.

FIGS. 2A–C are energy band diagrams for the conventional transistor 100 for three different gate voltage ($V_g$)

settings. The diagrams illustrate the electron energy levels as a function of position along section A—A' through the gate 112, the gate oxide 118 and the channel. In particular, the semiconductor conduction band edge ($E_c$) and valence band edge ($E_v$) in the substrate 140 are shown. The channel in the MOSFET 100 is a part of the substrate 140. The Fermi level ($E_f$) in the conductive gate 110 is displaced relative to the Fermi level in the substrate 140 when a voltage is applied to the gate 112, due to the voltage drop (equal to $V_g$) that appears across the gate oxide 118.

The energy band diagrams can illustrate minority carrier behavior (i.e., inversion) and majority carrier behavior (i.e., depletion and accumulation). The present example illustrates the following gate bias conditions: a gate voltage greater than the MOSFET 100 threshold voltage ($V_t$) (FIG. 2A), a gate voltage equal to the threshold voltage (FIG. 2B), and a zero gate bias condition (FIG. 2C).

The conduction band ($E_c$) edge is pinned at the MOS interface. With zero gate voltage (FIG. 2C), substantially no current flows from the source 120 to the drain 130. As the gate bias is increased, the conduction band edge shifts lower in energy relative to the conduction band edge deeper in the substrate 140 until the conduction band crosses the Fermi level. The gate bias voltage at which an inversion layer begins to form, and the channel layer begins to conduct, is illustrated in FIG. 2B. This gate voltage is approximately equal to the threshold voltage of the MOSFET 100.

As the gate bias is increased beyond the threshold voltage condition, the conduction band edge is driven below the Fermi level, as illustrated in FIG. 2A. This causes formation of an inversion layer, i.e., an enhanced density of minority carrier electrons by the interface of the gate oxide 118 and silicon substrate 140. For gate voltages greater than the threshold voltage of the MOSFET 100, a current flows between the source 120 and the drain 130 when a voltage difference exists between the source 120 and drain 130. In this manner, the magnitude of the drain current may be controlled by the gate bias in the MOSFET 100.

Figure 3A:
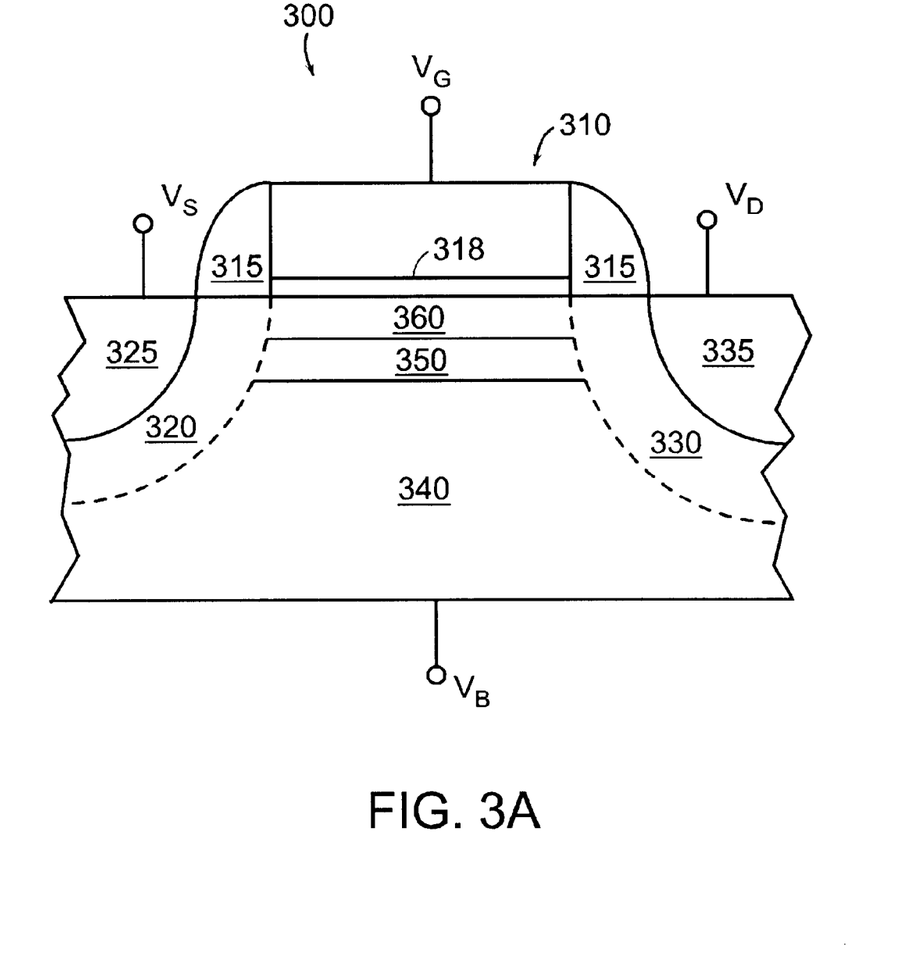
FIG. 3A is a cross-sectional view of an embodiment of a transistor configured and operated according to the invention.

FIG. 3A illustrates an embodiment of a transistor 300 configured and operated according to principles of the invention. FIG. 3A is a cross-sectional view of a buried channel layer MOSFET 300. The MOSFET 300 includes a gate 310, spacers 315, a gate oxide 318, a source 320, a source contact 325, a drain 330, a drain contact 335, a substrate 340, a buried channel layer 350, and a surface layer 360. The gate 310 can include, for example, doped polysilicon adjacent to the gate oxide 318 and can include other conductive materials, such as a silicide cap.

The gate oxide 318 can be silicon dioxide, or can include one or more other dielectric materials. The source 320 and drain 330 can be formed, for example, via dopant implantation, with the spacers 315 controlling the extent of dopant diffusion beneath the gate 310. Subsequently, silicide formation can provide the source contact 325 and the drain contact 335.

Various voltages can be applied to the MOSFET 300 via various terminals, including a gate voltage ($V_g$), a source voltage ($V_s$), a drain voltage ($V_d$) and a back-bias voltage ($V_b$). The back-bias voltage can be applied at the backside of the substrate 340, as depicted, or at some other location. For example, the MOSFET 300 can reside within a diffused dopant-defined well, with the back-bias voltage applied to the well. Thus, the back-bias voltage can also be referred to as a body-bias or substrate-bias voltage.

The buried channel layer 350 is formed from a semiconductor having a different composition than the surface layer 360 and the substrate 340. Hence, the buried channel layer has hetero-interfaces with the surface layer 360 and with the substrate 340. The hetero-interfaces are associated with conduction band and/or valance band offsets. The offsets can promote the confinement of free charge carriers within the buried layer 350.

In some embodiments, the buried channel layer 350 is subject to biaxial tensile or compressive stress. The induced strain in the buried channel layer 350 can be controlled via control of the composition of the substrate 340 and/or the buried channel layer 350. Control of the strain provides additional control over the electrical properties of the buried channel layer, for example, the minority carrier mobility.

The thickness of the buried layer 350 is chosen to avoid defect formation due to stress while providing sufficient thickness for inversion layer formation. For example, the thickness can be in a range of 4 nm to 40 nm. Preferably, the buried layer 350 is undoped or lightly doped.

The buried channel layer provides a dominant conduction pathway between the source 320 and the drain 330. For reasons discussed in greater detail below, application of a back-bias voltage, in cooperation with a gate voltage, causes an inversion region to form in the buried layer 350 while substantially avoiding formation of an inversion region in the surface layer 360. In preferred MOSFET embodiments, the gate voltage and the back-bias voltage have the same polarity: typically positive for an n-channel device, and negative for a p-channel device. For example, if the source is placed at ground, the back-bias voltage and the gate voltage are positive relative to the source for an n-channel buried layer.

Use of back-biasing permits control of carrier density distribution in the surface and buried layers 360, 350 with little or no doping of the buried layer 350. As described below with reference to FIG. 3B, the back-bias voltage shifts the energy bands of the surface layer 360 and the buried layer 350 to populate the buried layer with minority charge carriers without significantly populating the surface layer 360 with minority charge carriers.

The surface layer 360, the buried layer 350 and the substrate 340 can be formed from a variety of materials and materials compositions. In some embodiments, silicon and germanium are employed. In many of these embodiments, the substrate includes a SiGe layer or multiple SiGe layers and/or graded composition SiGe layers. The substrate can be formed, for example, from a silicon wafer, with the SiGe layers grown on the wafer. Other types of wafers can be used as a base for a substrate, e.g., silicon-on-insulator (SOI) wafers, germanium wafers, glass substrates and laminated substrates.

For example, the buried layer 350 can be a strained silicon layer epitaxially grown on a relaxed SiGe layer (constituting or at the surface of layer 340). The relaxed SiGe layer can be formed via methods known to those having ordinary skill in the SiGe semiconductor substrate arts. Alternatively, the buried layer 350 can be germanium or can be SiGe having a composition that is different from the SiGe of the relaxed layer.

For example, the buried channel layer 350 can have a composition $Si_{1-x}Ge_x$ while a relaxed layer portion of the substrate 340 can have a composition $Si_{1-y}Ge_y$. For x>y, the SiGe buried layer 350 would be subjected to compressive stress, and would thus exhibit a compressive strain. Moreover, material combinations can be chosen to provide a p-channel MOSFET, preferably in a compressively strained SiGe buried layer, or a n-channel MOSFET, preferable in a tensilely strained silicon layer.

Moreover, multiple layers can be included to provide both p-channel and n-channel MOSFETs on a single substrate. One set of transistors can utilize buried channel layers while the other set utilizes surface channels. Alternatively, both sets of transistors can utilize buried channel layers.

Figure 3B:
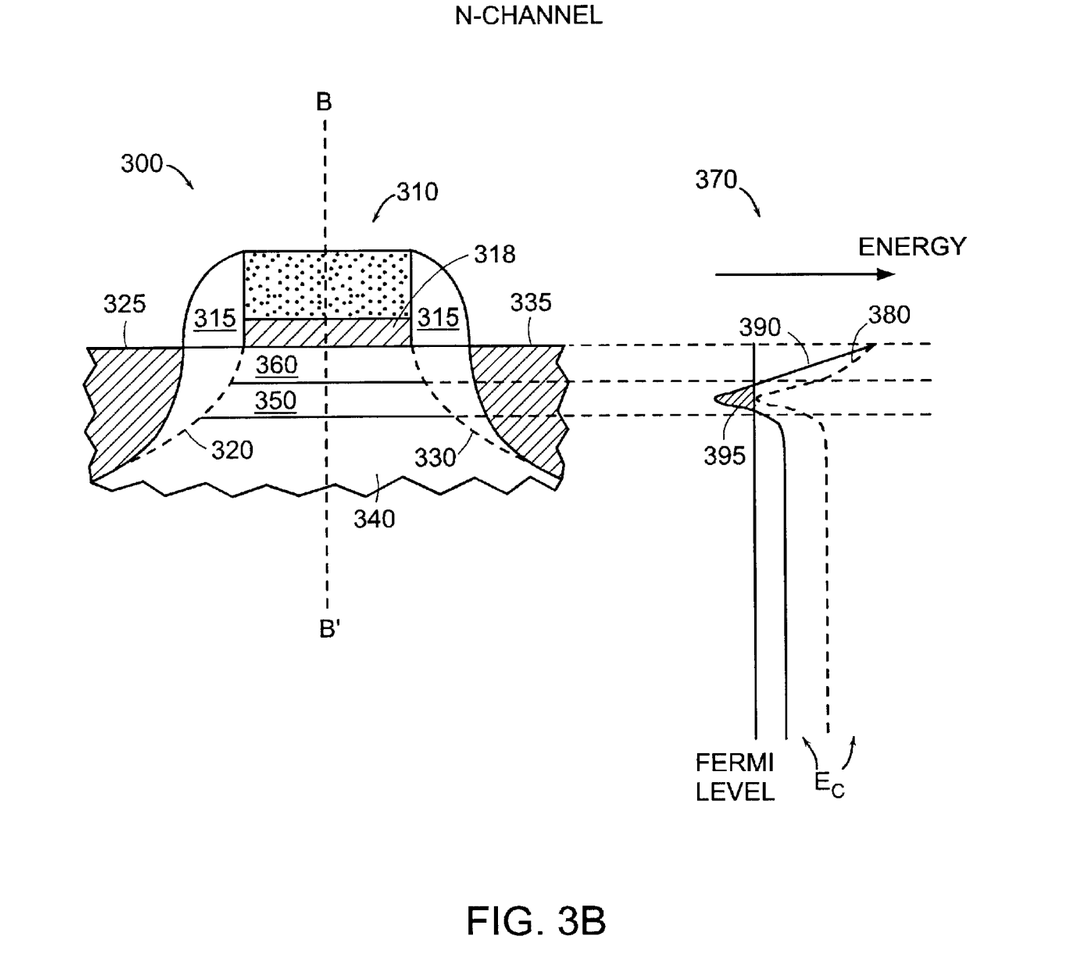
FIG. 3B is a cross-sectional view of the transistor of FIG. 3A, as well as a corresponding energy band diagram for section B—B' through the transistor.

Referring now to FIG. 3B, an embodiment of operation of the MOSFET 300 of FIG. 3A is described. If the MOSFET 300 is operated without appropriate control of a back-bias voltage, a conductive channel can form in the surface layer 360, creating an inferior, noisy parallel conduction path. The above described heterostructures, however, exhibit conduction and valence band offsets at the heterostructure interfaces. Energy band offsets, in the conduction band and/or valence band are utilized in conjunction with back-biasing to selectively populate buried channel layers with free charge carriers.

FIG. 3B illustrates a cross-sectional view of the buried n-channel MOSFET 300 and a related energy band diagram 370, which corresponds to positions in the MOSFET 300 along section B—B'. The MOSFET 300 energy band structure exhibits a type II heterojunction offset due to the hetero-buried silicon layer 350. The silicon buried channel layer 350 is also under tensile biaxial stress due to the lattice mismatch relative to the relaxed SiGe layer 340. The silicon in the buried channel layer 350 is intrinsic, i.e., undoped. In another embodiment, the buried channel layer is lightly doped, for example, with a n-type dopant such as phosphorus or arsenic.

The energy band diagram 370 illustrates behavior of the conduction band and Fermi level due to inversion layer control, in response to two back-bias conditions: zero back-bias condition 380 and a positive back-bias voltage condition 390. With no back-bias voltage applied (curve 380), the Fermi level lies below the conduction band at all locations along the section through the MOSFET 300. The conduction band edge is pinned in such a manner that the energy levels of the buried channel layer 350 lie above the Fermi level. The surface layer 360 and the buried layer 350 have negligible free electron densities. Application of a gate voltage could lead to formation of an inversion layer in the surface layer, at desired gate voltage operational levels.

With sufficient positive back-bias voltage (curve 390), a portion of the electron energy states in the quantum well defined by the buried channel layer 350 are populated (indicated by shading 395) without application of a gate voltage. At the same time, the surface layer 360 is relatively devoid of free electron charge carriers. Hence, a back-bias voltage can support a gate voltage to obtain source-to-drain conduction predominately via the buried channel layer 350. Further, the back-bias voltage can be selected to provide operation in a desired range of gate voltages.

Figure 6A:
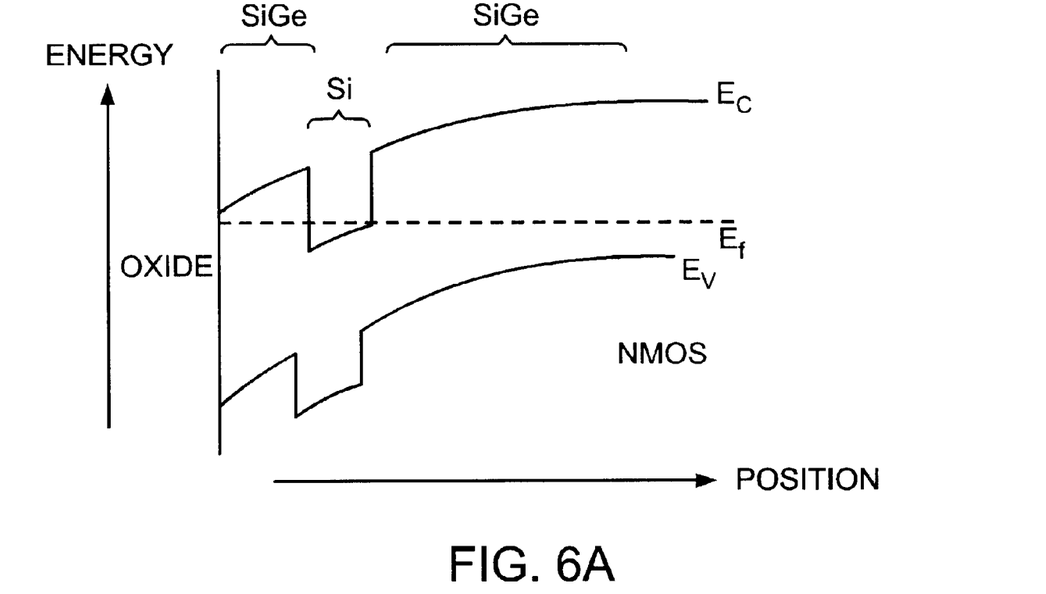
FIG. 6A is a band diagram for an embodiment of a MOSFET having a buried silicon layer.
Figure 6B:
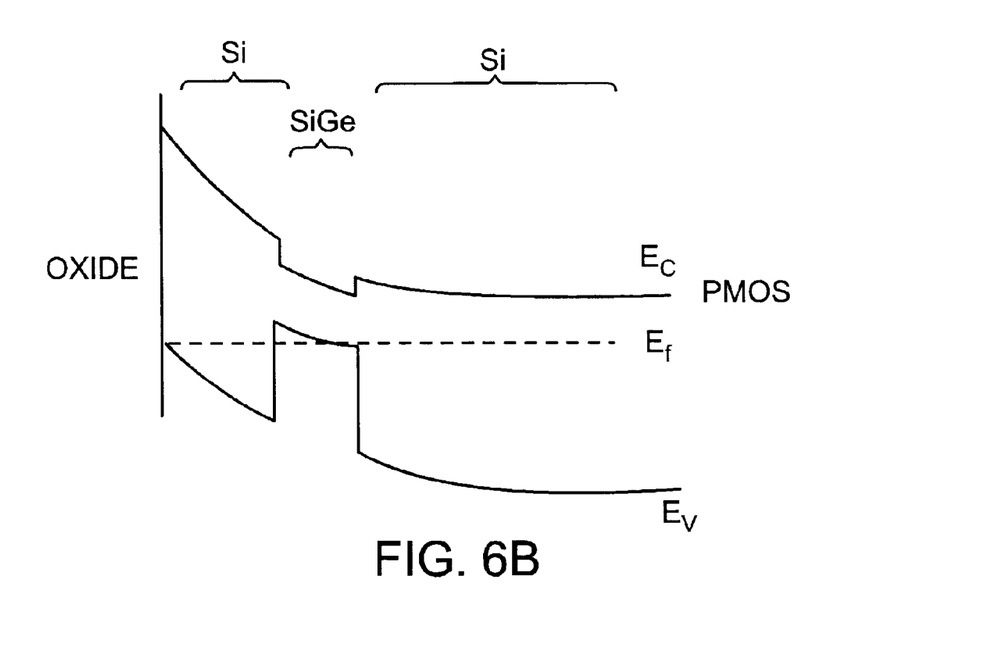
FIG. 6B is a band diagram for an embodiment of a MOSFET having a buried SiGe layer.

The conduction band offsets illustrated in FIG. 3B are gradual rather than abrupt, (the latter behavior is illustrated in FIGS. 6A and 6B). The gradual variation illustrates the behavior of a typical, real device, which has heterojunction interfaces that exhibit a somewhat gradual change in composition, rather than an abrupt composition change at the heterojunction interface. A compositionally abrupt interface it typically difficult to achieve. For example, the various elevated temperature processing steps typically required for fabrication of a device can cause some diffusion of atomic species that will blur the interface.

A sufficient back-bias voltage can be applied, for example, to place the buried channel layer 350 near to an inversion condition, and to place the surface layer 360 relatively far from an inversion condition, when no gate voltage is applied. Application of a small gate voltage then causes current flow via the buried layer 350 with substantially no current flow via the surface layer 360.

In this manner, back-biasing controls minority carrier density in both the surface layer 360 and the buried channel layer 350. Thus, proper use of back-biasing can mitigate the limitations of over-driving the gate voltage for buried channel devices. Cooperative selection of back-bias and gate bias voltages can provide gate voltage versus source-to-drain voltage ranges that are compatible with surface channel MOSFET-based devices. These features can ease integration of surface channel and buried channel transistors in a single device. Moreover, devices utilizing buried channel layers can utilize the same power supplies as conventional devices.

A range of useful back-bias voltage values can be limited by eventual forward biasing of the p-n junctions at the source and drain. This can allow undesirable current flow through the substrate rather than through the buried channel. Doping levels in the source, drain and substrate can affect the back-bias level that will cause a forward bias condition. With preferred dopant levels, a maximum useful back-bias voltage in some embodiments is in a range of approximately 0.25 to 0.40 volt. A maximum useful back-bias voltage can correspond to a voltage at which a source-to-substrate diode begins to contribute significant current to the source-drain characteristics.

In some embodiments, enhanced population of a buried layer remains possible with forward biasing of the source and/or drain, due to application of a back-bias voltage. Increased transconductance, which can be of value, for example, for analog and radio frequency applications, can be provided even under these conditions.

Figure 3C:
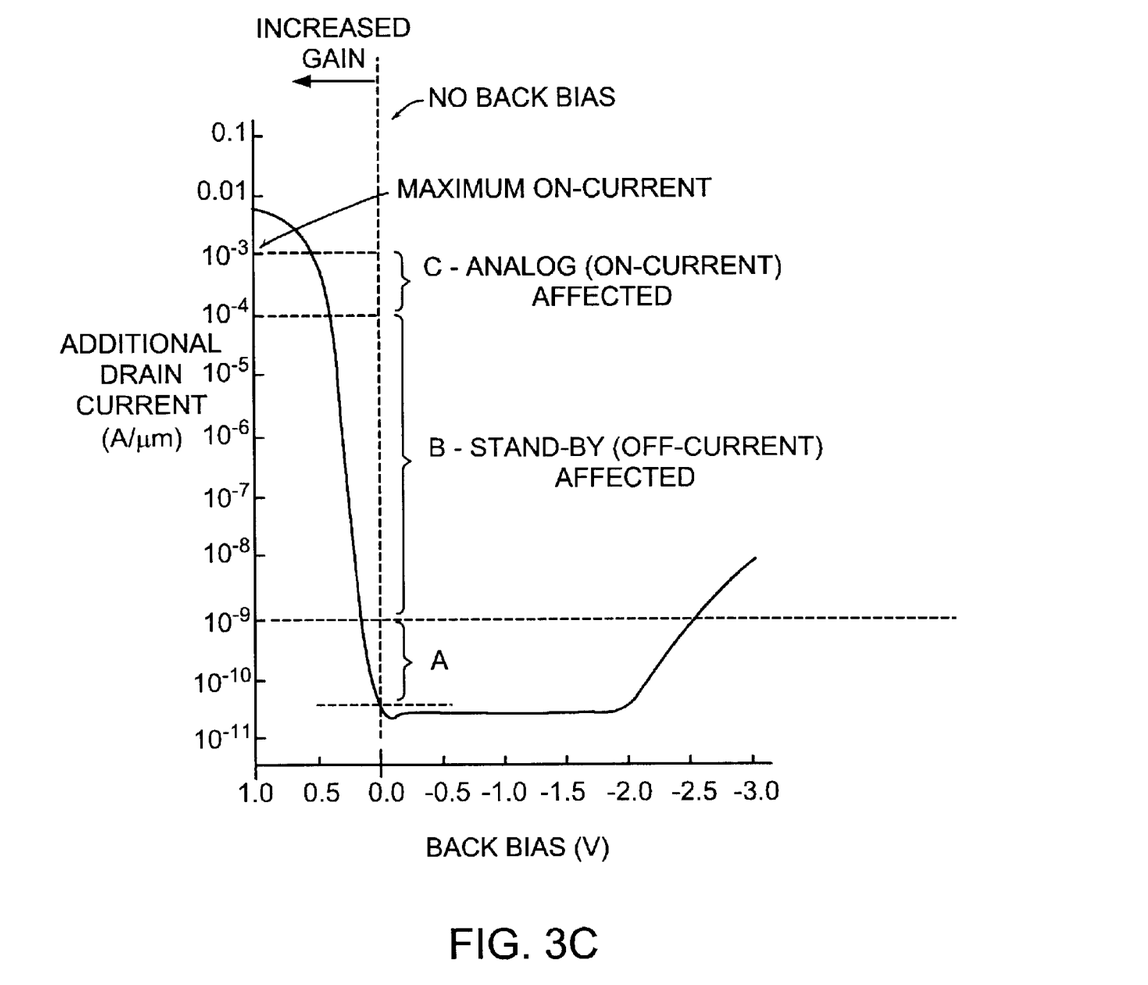
FIG. 3C is a graph of additional drain current versus back-bias voltage for a fabricated embodiment of a transistor.

FIG. 3C is a graph of additional drain current versus back-bias voltage, as measured for an embodiment of a n-MOSFET, including a buried channel layer, that was fabricated with a 0.25 μm process (i.e., minimum feature sizes corresponded to 0.25 μm). The graph shows the additional drain current that was associated with application of a corresponding back-bias voltage to the fabricated MOSFET. The back-bias voltage was applied between the substrate and ground, and the source of the MOSFET was tied to ground. The enhanced population of the buried layer caused the differential gain of the transistor to increase for back-bias voltages greater than 0 V.

In an off-state condition, the additional drain current remained below an acceptable 1 nA for back-bias voltages down to −2.5 V.

For a back-bias voltage of +0.1 V, i.e., at the boundary of region "A" and region "B" in the graph, the stand-by off-current of the MOSFET was 1 nA. Thus, a back bias of 0.1 V could be applied without substantially affecting power consumption of the MOSFET. Also, the Flicker noise could be substantially unaffected at this back-bias setting.

Back-voltages in a range of +0.1 V to +0.4 V (see region "B") could be used to provide operation in an "on", analog mode. The back-bias can provide, for example, an increase in transconductance and an increase in gain.

For this embodiment, the back-bias preferably is set closer to +0.1 V (as opposed to +0.4 V) for low-frequency oscillator operation of the MOSFET; additional current could contribute to Flicker noise.

If power consumption is of concern, for high-frequency, high-gain operation of the MOSFET, the back-bias preferably would approach without exceeding +0.4 V. If power consumption during on-state operation is not of concern, a back-bias voltage of up to +0.4 and greater could be applied.

Figure 4A:
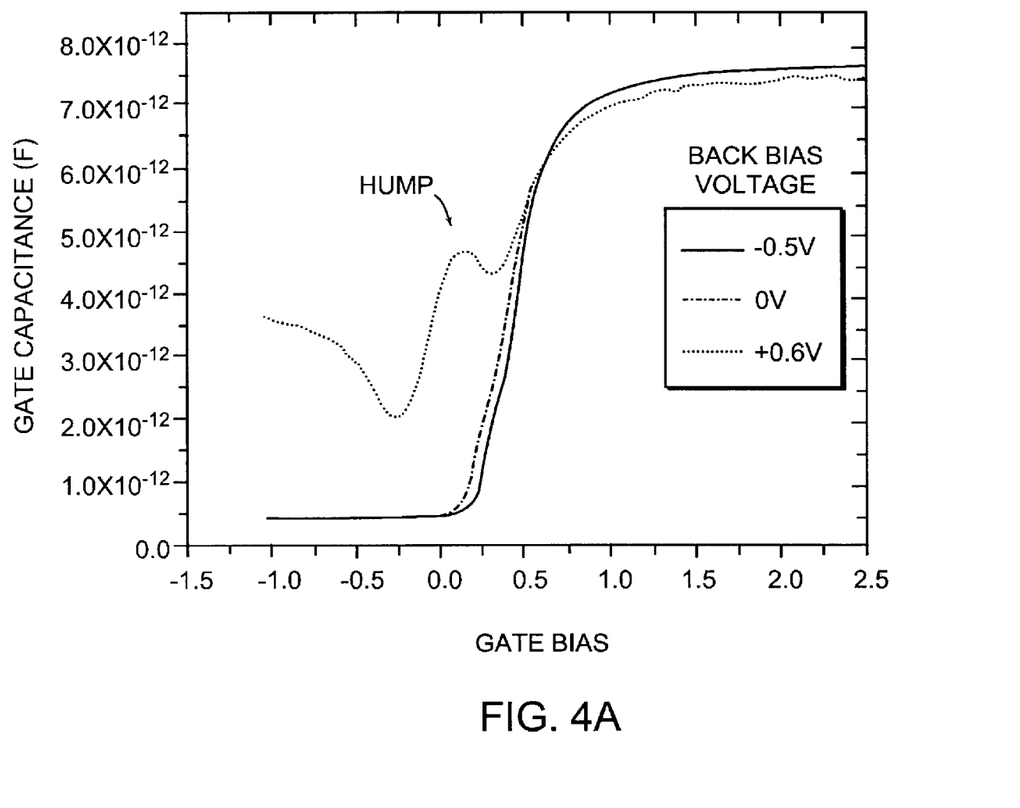
FIG. 4A is a graph of gate capacitance versus gate bias voltage for the transistor of FIG. 3A.

FIG. 4A is a graph of gate-to-inversion layer capacitance versus gate bias voltage (C-V) for a fabricated MOSFET that corresponded to the buried n-channel layer MOSFET 300 of FIG. 3A. The fabricated MOSFET had an area of approximately 10×100 μm, and included: a relaxed SiGe buffer layer of 30% Ge (atomic composition); a strained-Si buried layer of approximately 20 nm thickness; a SiGe surface layer of approximately 5 nm thickness (30% Ge); a gate oxide of approximately 4 nm thickness; and a polysilicon gate.

The curves shown in the graph were obtained via high-frequency C-V measurements, with three levels of back bias voltage. The measurement method was somewhat different from a typical C-V measurement method. The source and drain were tied, and the capacitance was measured between the gate and the tied source and drain. The range of lower capacitance values thus arose from stray capacitances, rather than from a depletion region thickness, as for typical C-V measurements. The range of higher capacitance values arose from the presence of an inversion layer adjacent to the gate oxide interface.

Three C-V curves corresponding to three fixed back-bias voltages are shown. A frequency dependence was found to be substantially absent, up to measurement frequencies of at least 1 MHz. For zero back-bias voltage, the capacitance attains a plateau at a maximum level when a gate voltage is attained which causes an inversion layer of electrons to form in the surface layer 360. The buried layer remains relatively unpopulated at all applied gate bias voltages for the zero back-bias condition. A similar C-V curve is obtained for a negative back-bias voltage.

In contrast, for a back-bias substrate voltage of +0.6 V, the C-V curve exhibits a large hump (an intermediate level of gate capacitance) intermediate to maximum and minimum capacitance plateaus at higher and lower gate voltages respectively. The hump that appears in the gate bias voltage range −0.25 V to +0.25 V corresponds to a range of gate bias voltages within which an inversion layer forms in the buried layer 350, and within which an inversion layer is substantially absent from the surface layer 360.

Thus, a back-bias voltage of +0.6 V, for this embodiment, cooperates with a variable gate voltage to provide a range of gate voltages within which an inversion layer exists in the buried channel layer 350, but not in the surface layer 360. Proper selection of a back-bias voltage also provides a gate voltage range having a subthreshold gate voltage behavior controlled by weak inversion of the buried layer 350 rather than by weak inversion of the surface layer 360.

Figure 4B:
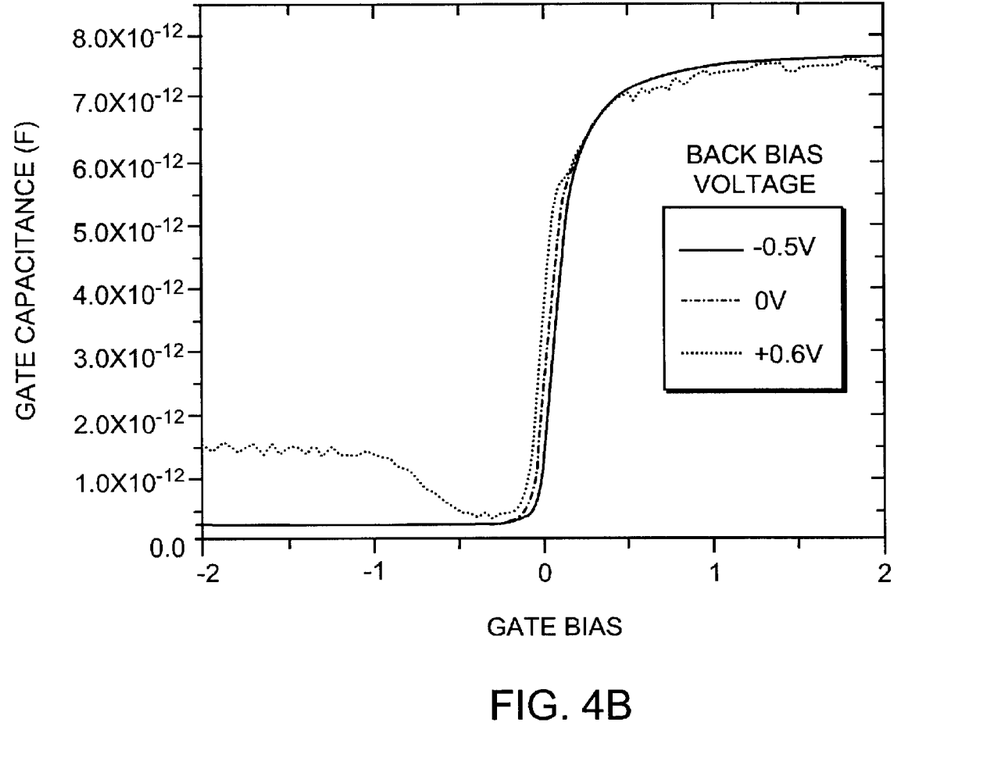
FIG. 4B is a graph of gate capacitance versus gate bias voltage for the n-channel MOSFET of FIG. 1.

Referring to FIG. 4B, C-V curves for the conventional MOSFET 100 are described to contrast the behavior of the conventional MOSFET 100 with the behavior of the appropriately back-biased buried channel layer MOSFET 300. FIG. 4B is a graph of three C-V curves of the conventional MOSFET 100 of FIG. 1. Each curve corresponds to a different, fixed back-bias voltage (the same three back-bias voltages of the graph in FIG. 4A). The C-V curves for the conventional MOSFET 100 exhibit no hump because an inversion layer only forms in a surface channel region.

Figure 5:
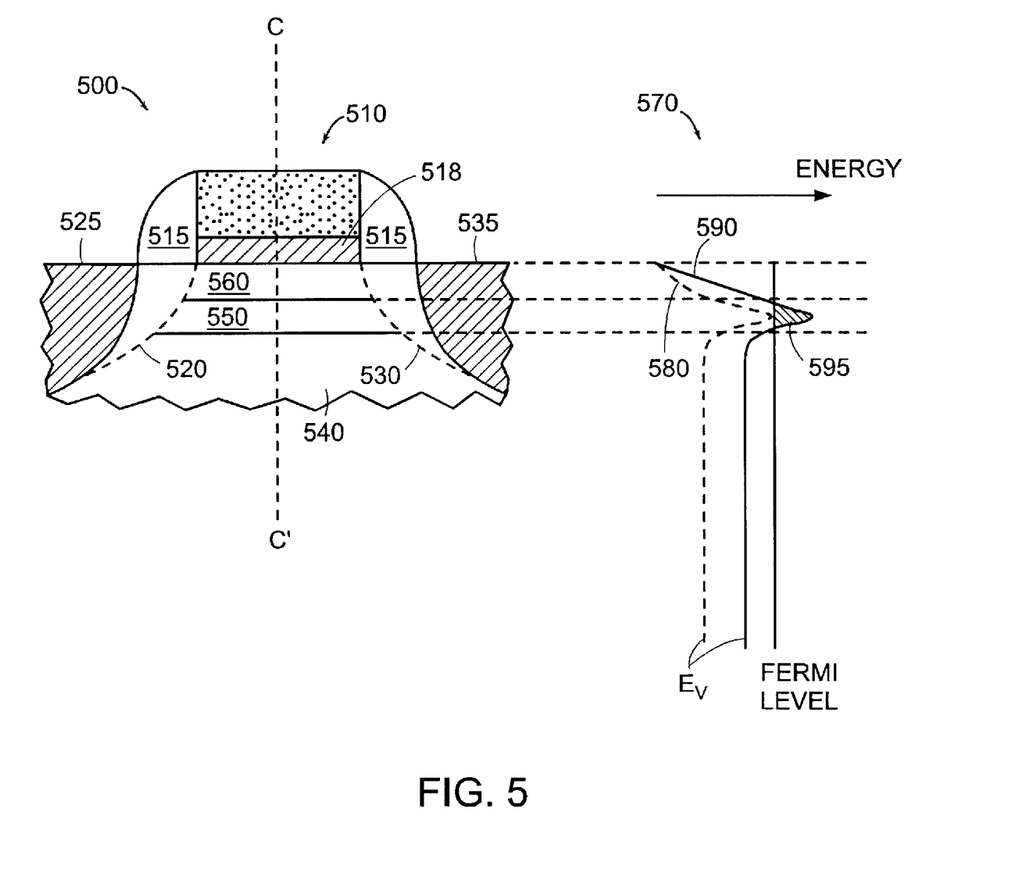
FIG. 5 is a cross-sectional view of an embodiment of a buried p-channel MOSFET, as well as a corresponding energy band diagram for section C—C' through the transistor.

FIG. 5 is a cross-sectional view of an embodiment of a buried p-channel MOSFET 500, according to principles of the invention, and a corresponding energy band diagram 570 for a section C—C' through the MOSFET 500.

The buried p-channel layer MOSFET 500 includes a buried p-channel layer 550 (formed from germanium), a gate 510, spacers 515, a p-type source 520, a source silicide contact 525, a p-type drain 530, a drain silicide contact 535, a relaxed SiGe layer 540 and a relatively strain-free SiGe surface layer 560. During preferred operation of the MOSFET 500, a negative back-bias voltage is applied for a range of negative gate voltages.

In some embodiments, the substrate is highly doped to minimize a voltage drop between a back-bias contact and a point below the gate.

The energy band diagram 570 demonstrates carrier behavior under a zero back-bias condition 580 and under a negative back-bias voltage condition 590. Under the zero back-bias condition 580, the conduction band edge is pinned so that the energy levels of the compressively strained germanium buried layer 550 lie below the Fermi level. In this case, no hole confinement occurs and the compressively strained germanium layer 550 remains essentially unpopulated.

As the back-bias voltage is made negative (curve 590), the valence band edge bends relative to the Fermi level. A quantity of hole energy levels become populated within the buried layer 550 (illustrated at 595). Once populated, with application of a source-to-drain voltage, current flows within the germanium buried layer 550 between the source 520 and the drain 530. In some embodiments, a back-bias voltage is selected to place the buried layer 550 in a near-populated state when the gate voltage is zero.

Some embodiments apply a back-bias voltage that populates a buried layer, even when no gate voltage is applied. Such embodiments are useful, for example, in high frequency RF applications. For example, such embodiments can help a gate of an amplifier circuit to respond to an incoming microwave signal.

As a further example, a device in amplifying mode generally must have an applied gate bias. Often, the device requires an additional gate bias, which typically must be decoupled from an incoming signal via use of an inductor connected from the gate to the substrate. Connection of the inductor to the gate can introduce noise into the incoming signal, and also can cause the loss of some signal to ground. Back biasing the substrate can potentially eliminate a need for a bias-strapping inductor on an input line; an inductor can be moved to a less damaging position on a substrate side of a device.

Some preferred embodiments of the invention use relaxed SiGe layers grown on silicon substrates. Silicon, germanium and SiGe layers can be grown via known epitaxial growth techniques. Growth of a buried layer of silicon, germanium or SiGe on a SiGe relaxed layer, or SiGe on silicon, enables production of buried layers of controlled stress and dislocation density. Examples of SiGe substrates, in which the Ge content can be up to 100%, include:

A relaxed, uniform composition SiGe layer on a graded composition SiGe layer atop a Si substrate.

A relaxed, uniform composition SiGe layer directly atop a Si substrate.

A relaxed, uniform composition SiGe layer on an insulating layer like $SiO_2$ atop a Si substrate.

The hetero-buried channel layers are preferably relatively thin. These channel layers can be single layers of Si, SiGe, or Ge, or a multiple-layer stack consisting of layers of Si, SiGe, or Ge.

Referring now to FIGS. 6A and 6B, band diagrams for MOSFETs having buried silicon or buried channel layers are qualitatively illustrated. FIG. 6A is a band diagram for an embodiment of a MOSFET having a buried silicon layer. The buried layer resides on a relaxed SiGe layer and has a SiGe surface layer of similar composition. Preferred embodiments can include a silicon cap to assist formation of a high quality gate oxide.

The silicon buried layer exhibits a type II band gap offset. With appropriate use of back-biasing, and n-type source and drain doping, an electron inversion layer is formed in the silicon buried layer to provide n-type MOSFET operation.

FIG. 6B is a band diagram for an embodiment of a MOSFET having a buried $Si_{1-x}Ge_x$ layer, where x=0.36. The buried layer resides on a silicon substrate and has a silicon cap surface layer. The $Si_{1-x}Ge_x$ buried layer exhibits a type I band gap offset. With appropriate use of back-biasing, and p-type source and drain doping, a hole inversion layer is formed in the $Si_{1-x}Ge_x$ buried layer to provide p-type MOSFET operation.

Though MOSFETs for many applications are operated in over-drive mode, i.e., with gate voltage greater than the MOSFET threshold voltage, MOSFETs according to principles of the invention are preferably operated at lower gate voltages. Preferred embodiments of the invention include transistors operated in sub-threshold conditions. Many transistor embodiments having improved transconductance are well suited to analog and radio frequency operation. Embodiments intended for low frequency operation, for example, as applicable to oscillator circuits, can exhibit reduced Flicker noise.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A method for operating one or more transistors, comprising:

providing a transistor comprising a buried channel layer intermediate to a source and a drain, and a surface layer intermediate to the buried layer and a gate;

applying a voltage to the gate to control a current between the source and the drain; and causing the current to flow predominately through the buried channel layer by applying a back-bias voltage to the transistor to modulate a free charge carrier density distribution in the buried layer and in the surface layer.

2. The method of claim 1, wherein applying the back-bias voltage comprises. substantially preventing formation of an inversion region in the surface layer.

3. The method of claim 1, wherein applying the back-bias voltage comprises selecting the back-bias voltage in cooperation with the gate voltage to cause radio frequency operation of the transistor.

4. The method of claim 1, wherein applying the voltage to the gate comprises selecting a range of gate voltages to operate the transistor in a substantially linear drain current versus source voltage condition.

5. The method of claim 1, wherein applying the voltage to the gate comprises operating the transistor as an analog device.

6. The method of claim 5, wherein operating the transistor comprises operating the transistor as a power device.

7. The method of claim 1, wherein the buried channel layer has a heterojunction interface.

8. The method of claim 1, wherein the buried channel layer comprises a strained semiconductor.

9. The method of claim 8, wherein the surface layer comprises a semiconductor that is substantially strain-free.

10. The method of claim 8, wherein the buried layer is intermediate to the surface layer and a relaxed layer comprising silicon and germanium.

11. The method of claim 8, wherein the strained semiconductor is under tensile strain, and applying the back-bias voltage comprises causing the buried channel layer to provide an n-type channel, and further comprising providing a second transistor associated with the first transistor and comprising a second buried channel layer comprising a semiconductor under compressive strain, and further comprising applying a second back-bias voltage to the second transistor to cause the second buried channel layer to provide a p-type channel.

12. The method of claim 1, wherein the buried channel layer comprises a quantum well.

13. The method of claim 1, wherein applying the back-bias voltage comprises applying the back-bias voltage to one of a substrate and an intermediate layer adjacent to the transistor.

14. A semiconductor device, comprising:

a transistor comprising a buried channel layer intermediate to a source and a drain, and a surface layer intermediate to the buried layer and a gate;

a terminal facilitating application of a voltage to the gate to control a current between the source and the drain; and a charge carrier modulator facilitating application of a back-bias voltage to the transistor to modulate a free charge carrier density distribution in the buried layer and in the surface layer to cause the current to flow predominately through the buried channel layer.

15. The device of claim 14, wherein the buried channel layer comprises a semiconductor under tensile strain.

16. The device of claim 15, wherein the buried channel layer consists substantially of silicon.

17. The device of claim 15, wherein the buried channel layer comprises silicon and germanium.

18. The device of claim 14, wherein the buried channel layer has a heterojunction interface that is associated with a heterojunction offset, the offset promoting confinement of free charge carriers in the buried channel layer.

19. The device of claim 18, wherein the heterojunction offset is one of a type I offset and a type II offset.

20. The device of claim 18, wherein the buried channel layer is a quantum well.

21. The device of claim 14, wherein the device is an analog device.

22. The device of claim 14, wherein the buried channel layer comprises a semiconductor under compressive strain.

23. The device of claim 22, wherein the buried channel layer consists substantially of germanium.

24. The device of claim 22, wherein the buried channel-layer comprises silicon and germanium.

25. The device of claim 14, further comprising a relaxed layer comprising silicon and germanium, in contact with the buried layer on a side opposite to the surface layer.

26. The device of claim 14, wherein the buried channel layer comprises a semiconductor under tensile strain providing an n-type channel, and further comprising a second transistor associated with the first transistor and comprising a second buried channel layer comprising a second semiconductor under compressive strain providing a p-type channel.

* * * * *